(12) United States Patent
Jeng et al.

(10) Patent No.: US 11,955,404 B2
(45) Date of Patent: Apr. 9, 2024

(54) ELECTRONIC PACKAGE AND HEAT DISSIPATION STRUCTURE THEREOF, COMPRISING BONDING PILLARS

(71) Applicant: AURAS TECHNOLOGY CO., LTD., New Taipei (TW)

(72) Inventors: Jian-Dih Jeng, New Taipei (TW); Chien-Yu Chen, New Taipei (TW); Wei-Hao Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 240 days.

(21) Appl. No.: 17/549,955

(22) Filed: Dec. 14, 2021

(65) Prior Publication Data

US 2022/0189849 A1 Jun. 16, 2022

Related U.S. Application Data

(60) Provisional application No. 63/126,068, filed on Dec. 16, 2020.

(51) Int. Cl.
*H01L 23/373* (2006.01)
*H01L 23/488* (2006.01)
*H01L 23/532* (2006.01)

(52) U.S. Cl.
CPC ........ *H01L 23/3736* (2013.01); *H01L 23/488* (2013.01); *H01L 23/53242* (2013.01)

(58) Field of Classification Search
CPC .................................................. H01L 23/3736
USPC ......................................................... 257/712
See application file for complete search history.

(56) References Cited

U.S. PATENT DOCUMENTS

| | | | | |
|---|---|---|---|---|
| 6,097,097 A | * | 8/2000 | Hirose | H01L 23/64 257/691 |
| 2002/0062648 A1 | * | 5/2002 | Ghoshal | H01L 23/427 165/104.33 |
| 2013/0062656 A1 | * | 3/2013 | Lee | H01L 25/0753 438/118 |

FOREIGN PATENT DOCUMENTS

CN 103872000 A * 6/2014 ............. H01L 24/11

* cited by examiner

*Primary Examiner* — Ajay Arora
(74) *Attorney, Agent, or Firm* — Amin, Turocy & Watson, LLP (57) ABSTRACT

An electronic package includes an electronic component and a heat dissipation structure, wherein the heat dissipation structure has a plurality of bonding pillars, and a metal layer is formed on the bonding pillars, so as to stably dispose the heat dissipation structure on the electronic component via the bonding pillars and the metal layer.

21 Claims, 6 Drawing Sheets

ELECTRONIC PACKAGE AND HEAT DISSIPATION STRUCTURE THEREOF, COMPRISING BONDING PILLARS

BACKGROUND

1. Technical Field

The present disclosure relates to a heat dissipation structure, and more particularly, to a heat dissipation structure for semiconductor components and related electronic packages.

2. Description of Related Art

With the increase in the demand for the function and processing speed of electronic products, as the core components of electronic products, semiconductor chips need to have higher density of electronic components and electronic circuits. Accordingly, semiconductor chips will subsequently generate a larger amount of heat energy during operation. Furthermore, since the traditional encapsulant for covering the semiconductor chips is made of poor heat transfer material, the heat is not easily dissipated. Therefore, if the heat generated by the semiconductor chips cannot be effectively dissipated, it will cause damage to the semiconductor chips and product reliability.

Therefore, in order to quickly dissipate heat to the outside, the industry usually configures a heat sink or a heat spreader in a semiconductor package. The heat sink is usually bonded onto the back of a chip with a heat-dissipating gel, such as a thermal interface material (TIM), so that the heat generated by the semiconductor chip can be dissipated by the heat-dissipating gel and the heat sink. Furthermore, the top surface of the heat sink is usually exposed from the encapsulant or directly exposed to the atmosphere so as to obtain a better heat dissipation effect.

Figure 1:
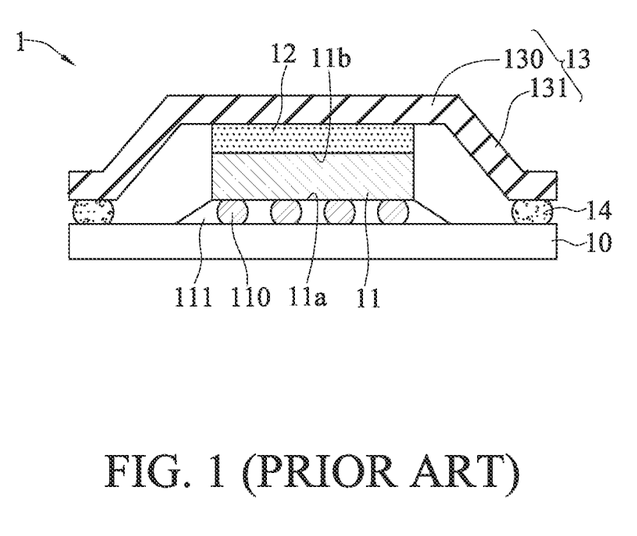
FIG. 1 is a schematic cross-sectional view of a conventional semiconductor package.

As shown in FIG. 1, the conventional method for manufacturing a semiconductor package 1 is to first place a semiconductor chip 11 with its active surface 11a on a package substrate 10 using flip chip bonding (that is, through conductive bumps 110 and an underfill 111), and a heat sink 13 with a top plate 130 is subsequently reflow-bonded onto an inactive surface 11b of the semiconductor chip 11 through a TIM layer 12 (which includes a solder layer and flux), and supporting legs 131 of the heat sink 13 are erected on the package substrate 10 through an adhesive layer 14. After that, a packaging press molding operation is performed to provide an encapsulant (not shown) to cover the semiconductor chip 11 and the heat sink 13, and to expose the top plate 130 of the heat sink 13 from the encapsulant.

During operation, the heat generated by the semiconductor chip 11 is conducted to the top plate 130 of the heat sink 13 via the inactive surface 11b and the TIM layer 12 to dissipate heat to the outside of the semiconductor package 1.

However, in the conventional semiconductor package 1, the traditional heat sink 13 and the TIM layer 12 have limited thermal conductivity, and cannot meet the demand for high heat dissipation efficiency.

Therefore, how to overcome the above-mentioned problems of the prior art has become an urgent problem to be solved at present.

SUMMARY

In view of the various deficiencies of the prior art, the present disclosure provides a heat dissipation structure, comprising: a heat dissipation element having a plurality of first bonding pillars and a plurality of second bonding pillars; a first metal layer formed on the first bonding pillars and the second bonding pillars; and a second metal layer formed on the first metal layer.

In the aforementioned heat dissipation structure, each of the plurality of first bonding pillars has a height that is lower than a height of each of the plurality of second bonding pillars.

In the aforementioned heat dissipation structure, the second metal layer has a thickness that is greater than a thickness of the first metal layer.

In the aforementioned heat dissipation structure, the first metal layer and/or the second metal layer has a diameter that is greater than or equal to a diameter of each of the plurality of first bonding pillars.

In the aforementioned heat dissipation structure, the first metal layer and/or the second metal layer has a diameter that is greater than or equal to a diameter of each of the plurality of second bonding pillars.

In the aforementioned heat dissipation structure, the first metal layer is formed by a material of nickel.

In the aforementioned heat dissipation structure, the second metal layer is formed by a metal of gold.

In the aforementioned heat dissipation structure, the heat dissipation element has a body, so that the plurality of first bonding pillars and the plurality of second bonding pillars are disposed on the body.

In the aforementioned heat dissipation structure, the heat dissipation element has a cavity in which a working fluid flows. For example, a capillary structure is provided in the cavity. Alternatively, a plurality of heat dissipation fins are provided in the cavity.

The present disclosure further provides an electronic package, comprising: a carrying structure; an electronic component disposed on the carrying structure and electrically connected to the carrying structure; and the aforementioned heat dissipation structure bonded onto the electronic component via the second metal layer.

The aforementioned electronic package further includes a bonding layer disposed on the electronic component to bond the second metal layer to the electronic component.

It can be seen from the above that the electronic package of the present disclosure mainly employs first bonding pillars and second bonding pillars to strengthen the bonding force between a heat dissipation structure and an electronic component. Therefore, the present disclosure can allow the heat dissipation structure to be securely disposed on the electronic component, thereby avoiding the problem of the delamination of the heat dissipation structure, strengthening the overall structural strength of the electronic package, and improving the overall heat dissipation efficiency of the electronic package.

BRIEF DESCRIPTION OF THE DRAWINGS

FIGS. 2A-1 to 2a-3 are schematic partial cross-sectional views showing a method for manufacturing a heat dissipation structure according to the present disclosure.

DETAILED DESCRIPTIONS

The following describes the implementation of the present disclosure with specific examples. Those skilled in the art can easily understand the other advantages and effects of the present disclosure from the content disclosed in this specification.

It should be understood that, the structures, ratios, sizes, and the like in the accompanying figures are used to illustrate the content disclosed in the present specification for one skilled in the art to read and understand, rather than to limit the conditions for practicing the present disclosure. Any modification of the structure, alteration of the ratio relationship, or adjustment of the size without affecting the possible effects and achievable proposes should still fall in the range compressed by the technical content disclosed in the present specification. Meanwhile, terms such as "upper," "first," "second" and the like used herein are merely used for clear explanation rather than limiting practical range by the present disclosure, and thus, the alteration or adjustment of relative relationship thereof without essentially altering the technical content should be considered in the practical scope of the present disclosure.

Figure 2:
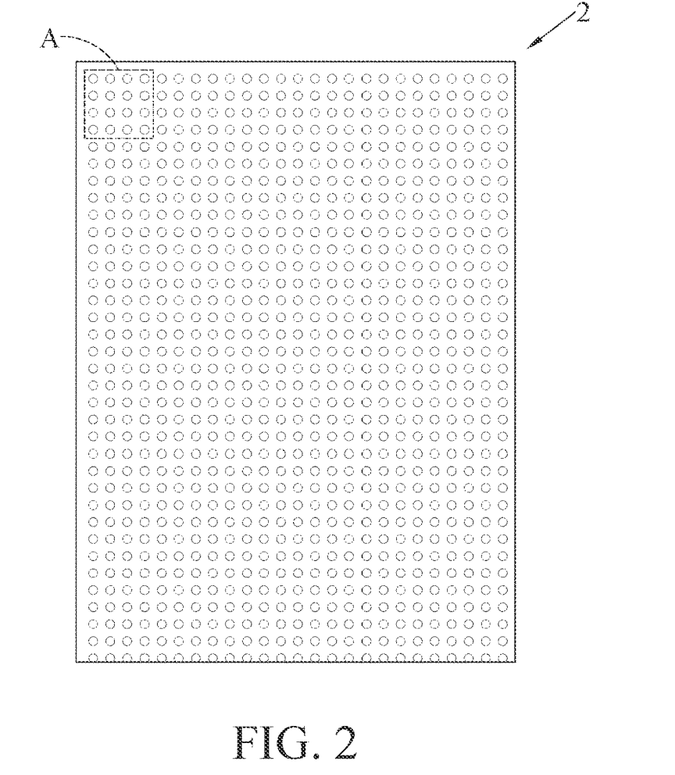
FIG. 2 is a schematic plan view showing a heat dissipation structure according to the present disclosure.
Figure 2A:
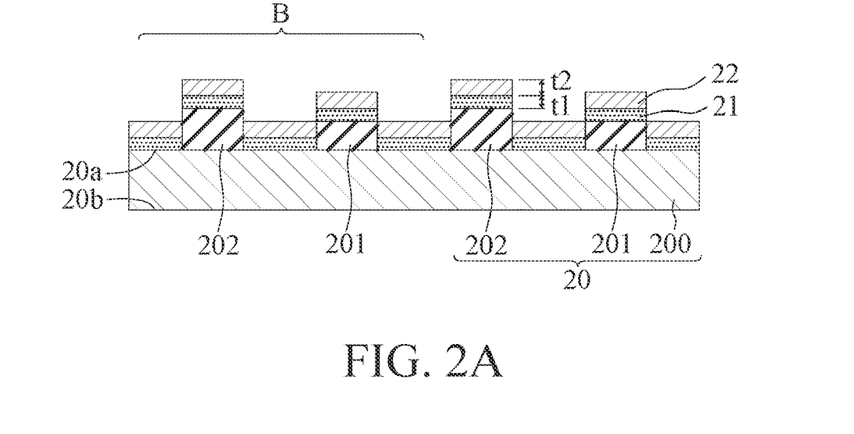
FIG. 2A is a schematic partial cross-sectional view showing the heat dissipation structure of FIG. 2.

FIG. 2 is a schematic plan view of a heat dissipation structure 2 of the present disclosure, and FIG. 2A is a schematic partial cross-sectional view of a partial area A of FIG. 2. As shown in FIG. 2A, the heat dissipation structure 2 includes: a heat dissipation element 20, a first metal layer 21 formed on the heat dissipation element 20, and a second metal layer 22 formed on the first metal layer 21.

Figure 4:
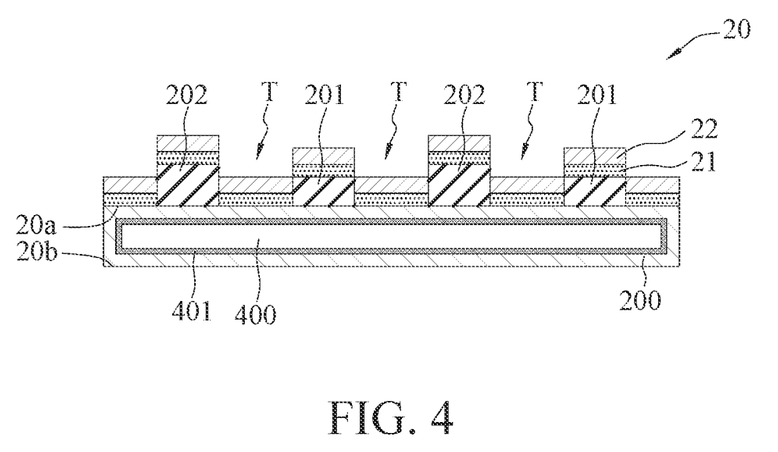
FIGS. 4 and 5 are schematic cross-sectional views showing other different embodiments corresponding to FIG. 2A.
Figure 5:
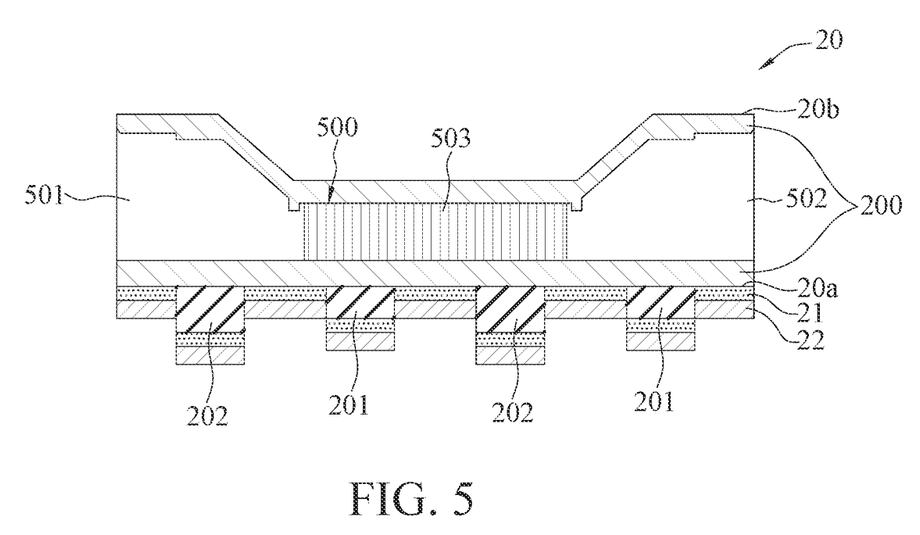

The heat sink 20 includes a body 200, such as a copper plate, a flat heat pipe, a vapor chamber or a cold plate, which has a first side 20a and a second side 20b opposite to each other. In one embodiment, as shown in FIG. 4, the heat dissipation element 20 is in the form of a vapor chamber, and the vapor chamber is a plate structure having a cavity 400 formed in the body 200. The cavity 400 is provided with a capillary structure 401. In addition, a working fluid (not shown) flows in the cavity 400, and is actuated by the circulation of evaporation and condensation of the working fluid in the cavity 400 to achieve a rapid constant temperature effect, thereby improving the overall heat dissipation efficiency of the heat dissipation element 20. In one embodiment, as shown in FIG. 5, the body 200 of the heat dissipation element 20 is in the form of a cold plate. The cold plate includes a cavity 500 and an inlet 501 and an outlet 502 communicating with the cavity 500, and a plurality of heat dissipation fins 503 are provided in the cavity 500. Besides, the plurality of heat dissipation fins 503 can be, for example, skived fins with extremely small gaps and extremely high arrangement density, so that the working fluid (not shown) can flow into the gap between two adjacent heat dissipation fins 503 to cool the heat absorbed by the plurality of heat dissipation fins 503, thereby improving the heat dissipation effect of the cold plate. In one embodiment, the working fluid can be water, ethanol, acetone, isopropanol, chlorofluorocarbon or refrigerant.

Furthermore, the first metal layer 21 and the second metal layer 22 are formed by a material of, such as nickel (Ni), gold (Au) or alloys thereof, and are sequentially formed on the heat dissipation element 20 by plating or sputtering. The first metal layer 21 is formed by a material that is different from the material forming the second metal layer 22. For example, the first metal layer 21 is formed by a material of nickel (Ni), and the second metal layer 22 is formed by a material of gold (Au). Additionally, the first metal layer 21 has a thickness t1 that is about 1 micrometer (μm), and the second metal layer 22 has a thickness t2 that is about 2 micrometers (μm).

Figure 2A:
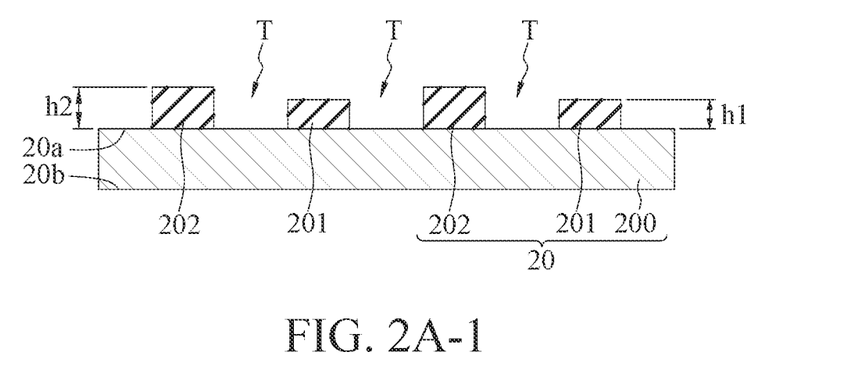
Figure 2A:
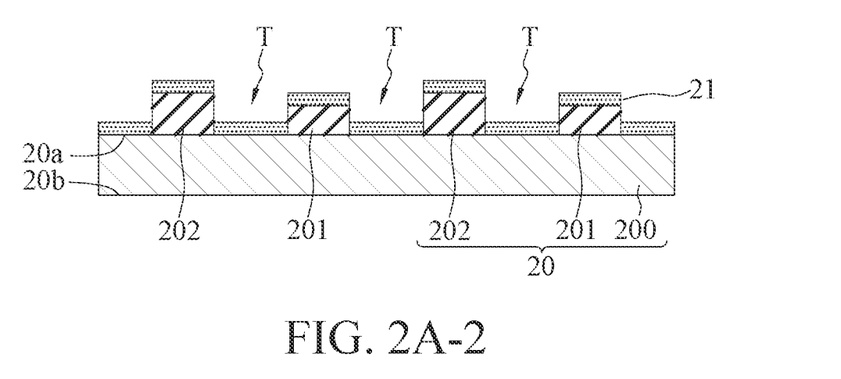
Figure 2A:
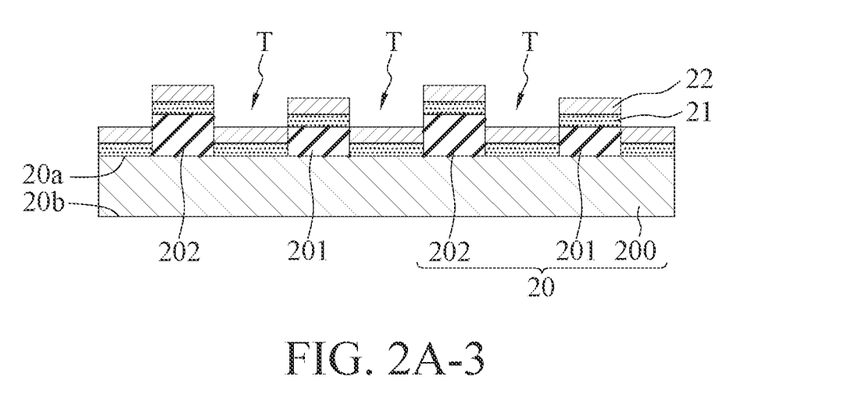

FIGS. 2A-1 to 2A-3 show a method for manufacturing the heat dissipation structure 2.

As shown in FIG. 2A-1, an etching process (such as a laser etching process) is used to form a plurality of first bonding pillars 201 and a plurality of second bonding pillars 202 arranged to be spaced apart from each other (such as a gap T) on a first side 20a of the body 200, and the first bonding pillar 201 has a height h1 that is lower than a height h2 of the second bonding pillar 202. For example, each of the first bonding pillars 201 and each of the second bonding pillars 202 are arranged in a staggered array.

In an embodiment, each of the first bonding pillars 201 and each of the second bonding pillars 202 may be a cylindrical structure or a pillar structure of other shapes.

In an embodiment, each of the first bonding pillars 201 has a height h1 that may be about 3 micrometers (μm), and each of the second bonding pillars 202 has a height h2 that may be about 5 micrometers (μm).

As shown in FIG. 2A-2, the first metal layer 21 is formed on an end surface of each of the first bonding pillars 201, an end surface of each of the second bonding pillars 202, and the first side 20a of the body 200 (that is, in the gap T) by plating or sputtering.

As shown in FIG. 2A-3, the second metal layer 22 is formed on a surface of the first metal layer 21 by plating or sputtering.

Figure 2B:
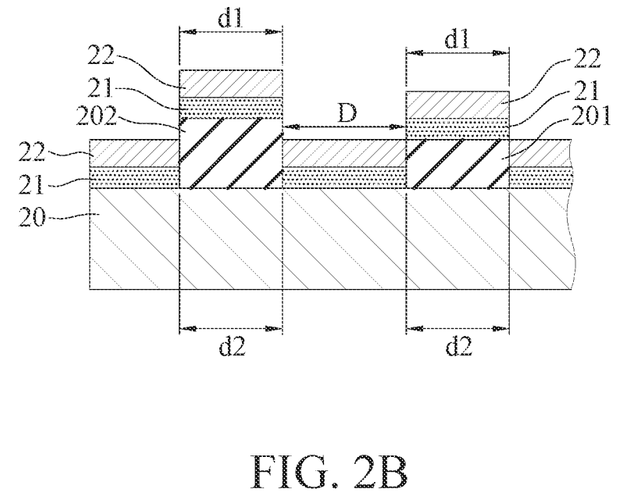
FIG. 2B is a schematic partial enlarged cross-sectional view showing the heat dissipation structure of FIG. 2A.

FIG. 2B is an enlarged view of a partial area B of FIG. 2A. As shown in FIG. 2B, the first metal layer 21 and the second metal layer 22 formed on each of the first bonding pillars 201 (or each of the second bonding pillars 202) have a diameter d1 that may be equal to or greater than a diameter d2 of each of the first bonding pillars 201 (or each of the second bonding pillars 202), and the first metal layer 21 and the second metal layer 22 formed on each of the first bonding pillars 201 have a distance D from the adjacent second bonding pillars 202 (in other words, the first metal layer 21 and the second metal layer 22 formed on each of the second bonding pillars 202 have a distance from the adjacent first bonding pillars 201).

For example, the first metal layer 21 and the second metal layer 22 have a diameter d1 that may be about 12 micrometers (μm), and each of the first bonding pillars 201 (or each of the second bonding pillars 202) have a diameter d2 that may be equal to or less than 12 micrometers (μm). Besides, the distance D between each of the first bonding pillars 201 and each of the second bonding pillars 202 may be about 10 micrometers (μm).

Figure 3A:
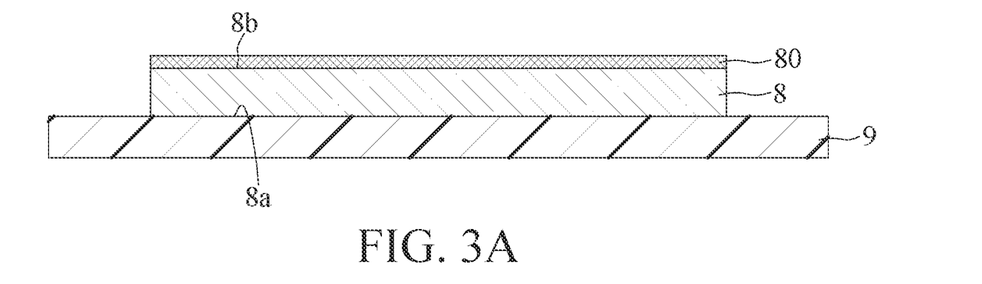
FIGS. 3A to 3C are schematic cross-sectional views showing the method for manufacturing an electronic package according to the present disclosure.
Figure 3B:
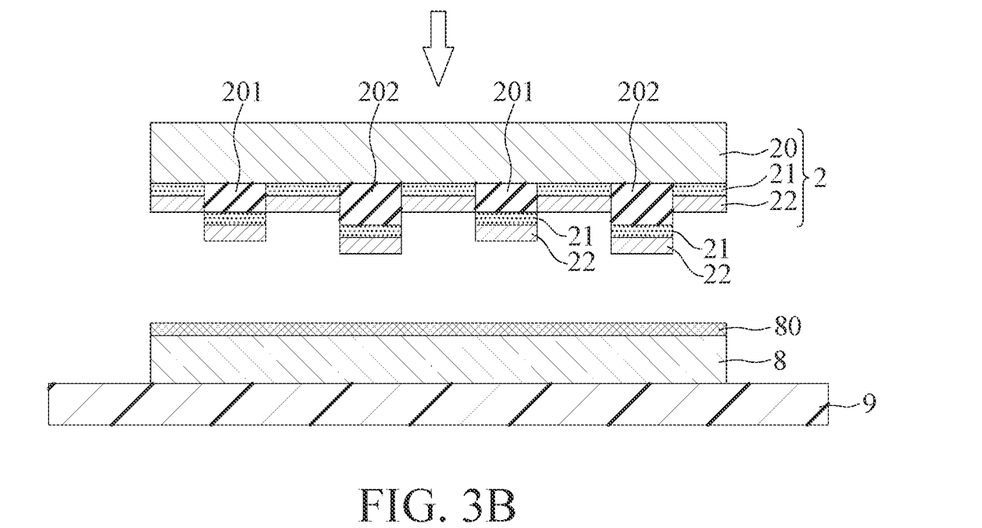
Figure 3C:
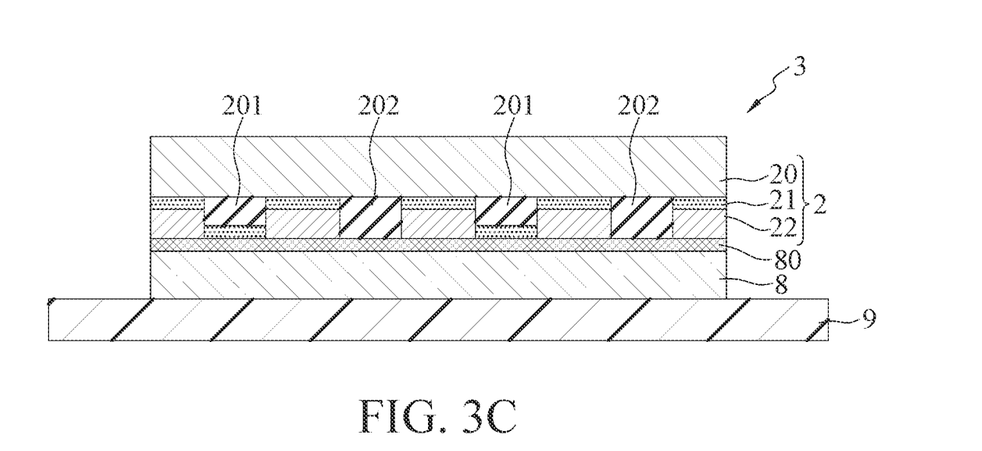

FIGS. 3A to 3C are schematic cross-sectional views of a method for manufacturing an electronic package 3 of the present disclosure.

As shown in FIG. 3A, a carrying structure 9 is provided, and at least one electronic component 8 is disposed on the carrying structure 9.

In an embodiment, the carrying structure 9 is, for example, a package substrate with a core layer, a coreless package substrate, and a through silicon interposer (TSI) with a through-silicon via (TSV) or other board types, and includes an insulating part and at least one circuit part (not shown) that bonded to the insulating part, such as at least one fan out redistribution layer (RDL). It should be understood that the carrying structure 9 may also be other substrates for carrying electronic components, such as lead frames, wafers, or other boards with metal routing, but is not limited thereto.

Moreover, the insulating part is a dielectric material, such as Ajinomoto Build-up Film (ABF), photosensitive resin, polyimide (PI), bismaleimide Triazine (BT), FR5 prepreg (PP), molding compound, epoxy molding compound (EMC) or other appropriate materials, and the circuit part is formed by patterning a metal material such as copper (Cu) or alloy thereof, but is not limited thereto.

Furthermore, the electronic component 8 is an active component, a passive component or a combination thereof. The active component is, for example, a semiconductor chip, and the passive component is, for example, a resistor, a capacitor and an inductor. In an embodiment, as shown in FIG. 3A, the electronic component 8 is a semiconductor chip, which has a first surface 8a and a second surface 8b opposite to each other. The first surface 8a has a plurality of electrode pads (not shown), which are disposed on the carrying structure 9 and electrically connected to the circuit part by flip-chip using a plurality of conductive bumps (not shown) such as solder materials, metal pillars or the like. A bonding layer 80 is formed on the second surface 8b of the electronic component 8. In one embodiment, the bonding layer 80 is made of a metal material such as tin (Sn) or solder.

As shown in FIGS. 3B to 3C, the heat dissipation structure 2 is disposed on the second surface 8b of the electronic component 8, so that the bonding layer 80 and the heat dissipation structure 2 are bonded to each other.

In one embodiment, the heat dissipation structure 2 and the bonding layer 80 are bonded to each other via the second metal layer 22 by using the technology of thermosonic bonding. For example, the first metal layer 21 and the second metal layer 22 formed on each of the first bonding pillars 201 and each of the second bonding pillars 202 are bonded in the bonding layer 80.

Therefore, the electronic package 3 of the present disclosure mainly employs the first bonding pillar 201 and the second bonding pillar 202 with different heights of the heat dissipation structure 2 in order to strengthen the bonding force between the heat dissipation structure 2 and the electronic component 8. Therefore, the present disclosure allows the heat dissipation structure 2 to be securely disposed on the electronic component 8, thereby avoiding the problem of the delamination of the heat dissipation structure 2, strengthening the overall structural strength of the electronic package 3, and improving the overall heat dissipation performance of the electronic package 3 at the same time.

The foregoing embodiments are used for the purpose of illustrating the principles and effects only rather than limiting the present disclosure. Anyone skilled in the art can modify and alter the above embodiments without departing from the spirit and scope of the present disclosure. Therefore, the range claimed by the present disclosure should be as described by the accompanying claims listed below.

What is claimed is:

1. A heat dissipation structure, comprising:
 a heat dissipation element having a plurality of first bonding pillars and a plurality of second bonding pillars;
 a first metal layer formed on the first bonding pillars and the second bonding pillars; and
 a second metal layer formed on the first metal layer, wherein the second metal layer has a thickness that is greater than a thickness of the first metal layer.

2. The heat dissipation structure of claim 1, wherein each of the plurality of first bonding pillars has a height that is lower than a height of each of the plurality of second bonding pillars.

3. The heat dissipation structure of claim 1, wherein the first metal layer and/or the second metal layer has a diameter that is greater than or equal to a diameter of each of the plurality of first bonding pillars.

4. The heat dissipation structure of claim 1, wherein the first metal layer and/or the second metal layer has a diameter that is greater than or equal to a diameter of each of the plurality of second bonding pillars.

5. The heat dissipation structure of claim 1, wherein the first metal layer is formed by a material of nickel.

6. The heat dissipation structure of claim 1, wherein the second metal layer is formed by a material of gold.

7. The heat dissipation structure of claim 1, wherein the heat dissipation element has a body for the plurality of first bonding pillars and the plurality of second bonding pillars to be disposed thereon.

8. The heat dissipation structure of claim 1, wherein the heat dissipation element is formed with a cavity for a working fluid to flow therein.

9. The heat dissipation structure of claim 8, wherein a capillary structure is further provided in the cavity.

10. The heat dissipation structure of claim 8, wherein a plurality of heat dissipation fins are further provided in the cavity.

11. An electronic package, comprising:
 a carrying structure;
 an electronic component mounted on the carrying structure and electrically connected to the carrying structure; and
 a heat dissipation structure bonded onto the electronic component via a second metal layer and comprising:
  a heat dissipation element having a plurality of first bonding pillars and a plurality of second bonding pillars;
  a first metal layer formed on the first bonding pillars and the second bonding pillars; and
  the second metal layer formed on the first metal layer, wherein the second metal layer has a thickness that is greater than a thickness of the first metal layer.

12. The electronic package of claim 11, further comprising a bonding layer formed on the electronic component to bond the second metal layer to the electronic component.

13. The electronic package of claim 11, wherein each of the plurality of first bonding pillars has a height that is lower than a height of each of the plurality of second bonding pillars.

14. The electronic package of claim 11, wherein the first metal layer and/or the second metal layer has a diameter that is greater than or equal to a diameter of each of the plurality of first bonding pillars.

15. The electronic package of claim 11, wherein the first metal layer and/or the second metal layer has a diameter that is greater than or equal to a diameter of each of the plurality of second bonding pillars.

16. The electronic package of claim 11, wherein the first metal layer is formed by a material of nickel.

17. The electronic package of claim 11, wherein the second metal layer is formed by a material of gold.

18. The electronic package of claim 11, wherein the heat dissipation element has a body for the plurality of first bonding pillars and the plurality of second bonding pillars to be disposed thereon.

19. The electronic package of claim 11, wherein the heat dissipation element has a cavity for a working fluid to flow therein.

20. The electronic package of claim 19, wherein a capillary structure is further provided in the cavity.

21. The electronic package of claim 19, wherein a plurality of heat dissipation fins are further provided in the cavity.

* * * * *